United States Patent

Thörnblad

[11] Patent Number: 5,859,545
[45] Date of Patent: Jan. 12, 1999

[54] BIDIRECTIONAL BUFFER

[75] Inventor: Hans Thörnblad, Vallentuna, Sweden

[73] Assignee: ICL Systems AB, Kista, Sweden

[21] Appl. No.: 777,000

[22] PCT Filed: Aug. 10, 1995

[86] PCT No.: PCT/EP95/03178

§ 371 Date: Apr. 14, 1997

§ 102(e) Date: Apr. 14, 1997

[87] PCT Pub. No.: WO96/05671

PCT Pub. Date: Feb. 22, 1996

[30] Foreign Application Priority Data

Aug. 12, 1994 [GB] United Kingdom ............ 9416380

[51] Int. Cl.$^6$ ............................................. H03K 19/082
[52] U.S. Cl. ............................................. 326/90; 326/82
[58] Field of Search ............................... 326/30, 82, 86, 326/90; 327/215, 333

[56] References Cited

U.S. PATENT DOCUMENTS

| | | | |
|---|---|---|---|
| 5,214,330 | 5/1993 | Okazaki | 326/30 |
| 5,248,908 | 9/1993 | Kimura | 326/38 |
| 5,587,824 | 12/1996 | Asprey | 326/90 |
| 5,736,870 | 4/1998 | Greason et al. | 326/86 |

FOREIGN PATENT DOCUMENTS

| | | |
|---|---|---|
| 0 044 397 | 1/1982 | European Pat. Off. . |
| 6 0064547 | 4/1986 | Japan . |

*Primary Examiner*—Jon Santamauro
*Assistant Examiner*—Don Phu Le
*Attorney, Agent, or Firm*—Lee, Mann, Smith, McWilliams, Sweeney & Ohlson

[57] ABSTRACT

A buffer circuit for use between a two-way open-collector bus line and a device capable of reading the status of the bus line and driving it low. The device has a single input/output terminal to which is connected a line of the buffer circuit. The buffer circuit is such as to distinguish between three logical levels on the line, and in particular between two logical low levels ($U_a$, $U_b$), which correspond to the device or an input buffer driving the bus line low. The input and output buffers are comprised by respective comparators. The reference voltage for the output buffer comparator lies between $U_a$ and $U_b$, whereby to achieve the distinction therebetween. When the output buffer comparator detects $U_a$, it causes the bus line to be driven low.

10 Claims, 1 Drawing Sheet

FIG 3

BIDIRECTIONAL BUFFER

This invention relates to bus line buffering and in particular to buffering for a two-way bus.

Devices connected to an open-collector bus (or an open-drain bus) must normally be able to read the status (high/low) of the bus lines, as well as be able to force them low by means of open-collector (or open-drain) drivers. It is often desirable to have buffer circuitry between the device, which may be an integrated circuit or a local sub-bus system, for example, and the bus, for one or more reasons, such as the following reasons:

1. To protect the device from destructive voltage transients on the bus. This would typically be the case if the device contains CMOS circuitry and the bus lines extend outside of a shielding cabinet.
2. The device may not be able to sink enough current to force the bus lines low.
3. If the device cannot be guaranteed not to force the bus lines low while it is in the power-off state, or while it is entering or leaving the power-off state.

Such buffering is easy to implement if the device D has separate terminals for input and output, ie one terminal 2 for reading an open-collector bus line (external line 4) and a different terminal 3 for forcing the line low, as illustrated in FIG. 1. There is an input buffer 5 connected between external line 4 and terminal 2 and an output buffer 6 connected between terminal 3 and line 4. The symbol in buffer 6 denotes an open-collector output.

However, if the input and output are handled by the same terminal, which is often the case, then buffering is more complicated. Simply paralleling an input buffer 5 with an output buffer 6 as shown in FIG. 2 would cause the line 4 to be locked low. Both buffers will remain low indefinitely as each one supplies a low input to the other one.

To overcome the problem, the output buffer 6 must be able to distinguish between two different causes for a low level on the device side, ie on the internal line:

A. The device D is pulling it low.

B. The device D is not pulling it low but the input buffer 5 is.

In Case A the output buffer 6 must pull the external line 4 low, but in Case B it must not.

There are commercially available buffer circuits which make this distinction by way of current sensing and current amplification. If a positive current is flowing into the device D on the internal line 7 (Case A), then the output buffer will sink a multiple of that current on the external line. The disadvantages of these buffer circuits are cost and the fact that the current amplification also causes capacitance amplification. The external line "sees" the internal capacitance multiplied by the current amplification factor. Furthermore, these buffer circuits may not be consistent with reasons 1 and/or 3 referred to above.

The present invention aims to provide a solution which does not suffer from the aforementioned disadvantages.

According to one aspect of the present invention there is provided a buffer circuit for use between a bus line and an input/output terminal of a device capable of reading the status of the bus line and driving it low, the buffer circuit including a line which is connected in use to the terminal, an input buffer in parallel with an output buffer, the input of the input buffer being connected to the output of the output buffer and connected in use to the bus line, the output of the input buffer being connected to the input of the output buffer and to the line, and the buffer circuit being such that two logical levels of the same type which may be present on the line and have different sources are distinguishable from one another, characterised in that the output buffer is in the form of a comparator which compares any said logical level with a reference level and interprets it as arising from a first source if it is less that the reference level or as arising from a second source if it is greater than the reference level, and the output buffer is such as to distinguish between two logical low levels on the line, whose sources are the device or the input buffer, respectively, pulling the line low, and wherein the output buffer is such as to pull the bus line low only when the device is pulling the line low.

According to another aspect of the present invention there is provided a method of buffering a connection between a bus line and a device capable of reading the status of the bus line and driving it low, including the step of disposing a buffer circuit including an input buffer and an output buffer, between the bus line and an input/output terminal of the device, the buffer circuit being connected by a line to the terminal; and characterised in that the output buffer is in the form of a comparator, and comprising the steps of determining whether a logical low level on the line is caused by the device or the input buffer pulling it low by comparing, at the output buffer comparator, any said logical low level on the line with a reference level and interpreting it as arising from the device if it is on one side of the reference level and as arising from the input buffer if it is on the other side of the reference level; and pulling the bus line low by means of the output buffer when the device is pulling the line low.

Embodiments of the invention will now be described with reference to accompanying drawings, in which FIG. 1 illustrates a first known buffer circuit;

The solution provided by the present invention does not involve the disadvantages associated with the prior art circuits and is suitable for use when there is a reasonable voltage margin between the low output level of the device D and the highest input voltage that the device D is guaranteed to interpret as low level. The solution distinguishes between cases A and B by comparing the two different low-level voltages on the internal line 7 with a reference. The line 7 will be at a high level when neither the device nor the input buffer is pulling it low. Hence there are three levels to be distinguished between on the internal line 7, although the invention is only concerned with distinguishing between the two low levels.

$U_a$ is defined as the low-level output voltage of the device D and $U_c$ is defined as the highest input voltage that the device D is guaranteed to recognise as low level. Let $U_b$ denote a voltage which is between $U_a$ and $U_c$ and is preferably closer to $U_c$ than $U_a$. The input buffer is, according to the invention, designed so that its low-level output pulls down the internal line 7 to level $U_b$ when the device D is not pulling the internal line 7 low, and the output buffer is designed so that it interprets $U_a$ as low (Case A) and $U_b$ as high (Case B). When the low level corresponds to $U_a$ (the device) the output buffer pulls the external (bus line) 4 low.

In a practical realisation the input and output buffers may be implemented by a low cost comparator, such as an LM339 comparator, with or without an extra transistor, depending upon requirements, as will be apparent from the following.

Figure 1:
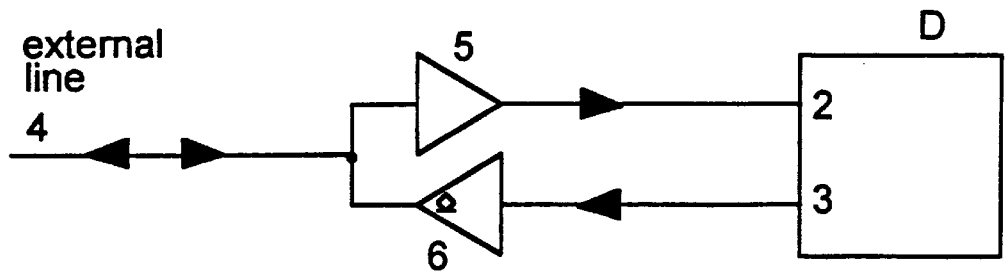
Figure 2:
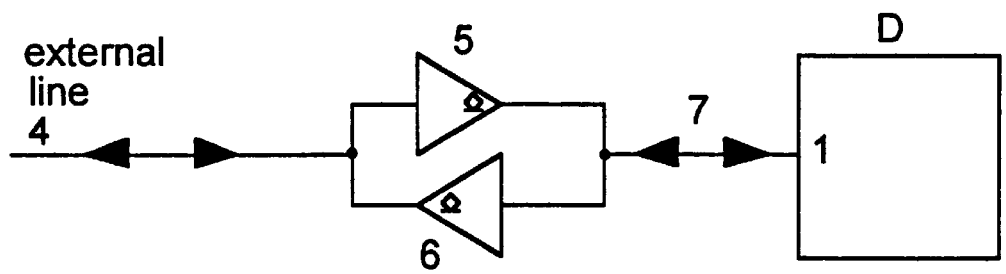
FIG. 2 illustrates an impractical buffer circuit.
Figure 3:
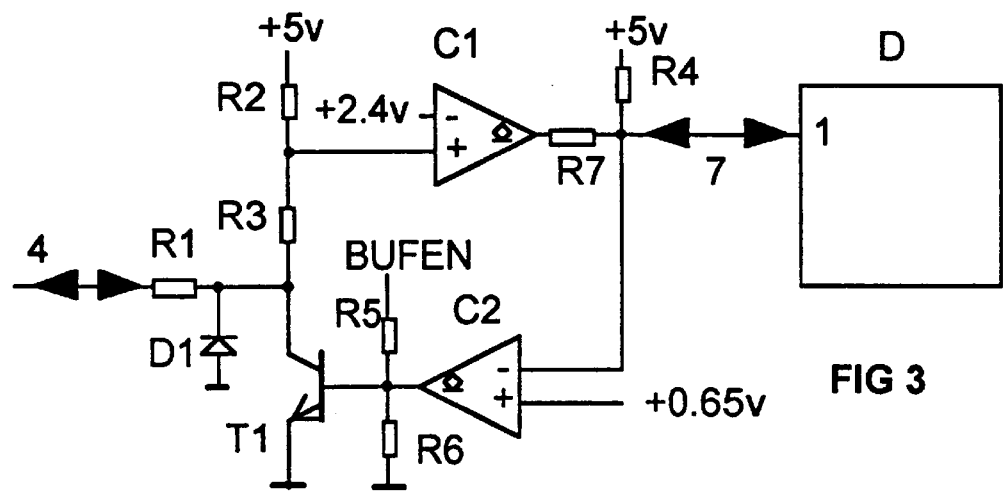
FIG. 3 illustrates a specific embodiment of the present invention.

The first example, illustrated in FIG. 3, relates to an arrangement for use, for example, in a video monitor where the external line (bus) is an ACCESS bus or I²C bus. In this case the device D consists of a local bus to which one or more integrated circuits with I²C ports are connected. It is assumed that all of the reasons 1, 2 and 3, as referred to above with respect to prior art arrangements, apply. If this is not the case, the implementation can be simplified.

The I²C bus, consists of two bus lines (a clock line and a data line) but FIG. 3 applies equally to either of them. The LM339, which is a low cost comparator integrated circuit with open-collector outputs, contains four comparators, two of which C1 and C2 are employed in the FIG. 3 embodiment. Thus only one LM339 is needed for the overall bus. The LM339 requires a +5V power supply and this may be supplied from a host PC associated with the video monitor or derived from the monitor supply itself, for example.

The low-level output of I²C ports is $\leq 0.4$ volts at 3 mA sink current, so that with a 3.92K ohms load resistor R4, $U_a$ will be less than 0.4V and typically 0.2V. $U_c$ for I²C ports is 1.5V. The voltage divider R7/R4 (909 ohms/3.92 Kohms) will make $U_b$ nominally equal to 1.0V, which is safely below $U_c$, and the output comparator C2 can safely distinguish between $U_a$ (Case A) and $U_b$ (Case B).

The output transistor T1 (2N2369 or equivalent) can sink at least 20 mA. Reason 3 is safely taken care of if the signal BUFEN is high when the +5V power supply is stable only. The latter can be achieved by deriving BUFEN from the reset and/or power-watch circuitry that is normally present in a microprocessor system such as of a video monitor. If reason 3 is unimportant, then BUFEN can be simply replaced by a direct connection to +5V.

Both the LM339 input (comparator C1) and the transistor T1 (2N2369) can withstand voltage transients up to +36V from the external line, whether the +5V is on or not. Negative transients are absorbed by diode D1 (1N4148), combined with the fact that the input to the LM339 will then be 0.9V more positive, because of the divider R3/R2, using the values 6.8K/39K, so that the LM339 comparator C1 never gets input levels that are negative enough to disturb proper operation.

The reference voltages +2.4V and +0.65V may be obtained from the +5V supply by means of a three-resistor voltage divider.

For the example described, R1 is 51 ohms, R5 is 4.7 Kohms and R6 is 3.3 Kohms, when the values of R2, R3, R4 and R7 are as quoted above.

Figure 4:
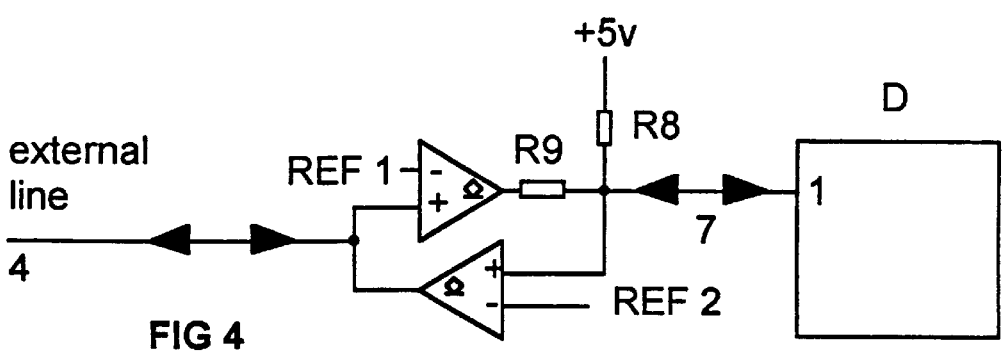
FIG. 4 illustrates a more general arrangement of the embodiment of FIG. 3.

The circuitry of the example shown in FIG. 3 may be simplified, depending on requirements. FIG. 4 shows a basic implementation circuit which is sufficient if the chosen comparator integrated circuit is adequate as it is for the various requirements. The values of R8 and R9 can be the same as or different to the values of R4 and R7 referred to above.

Whilst a +5 volt supply is indicated in FIGS. 3 and 4, this is not the only possibility and in the arrangement of FIG. 3 the quoted reference values are also not the only possibilities. The values employed will be dictated by the components employed and practical concerns.

I claim:

1. A buffer circuit for use between a bus line and an input/output terminal of a device capable of reading the status of the bus line and driving it low, the buffer circuit including a line which is connected in use to the input/output terminal, an input buffer in parallel with an output buffer, the input of the input buffer being connected to the output of the output buffer and connected in use to the bus line, the output of the input buffer being connected to the input of the output buffer and to the line, wherein a signal with either of two logical low levels and having respective first and second sources may be present on the line, and the buffer circuit being such that the two logical low levels are distinguishable from one another, wherein the output buffer is in the form of a comparator which compares the signal level with a reference level and interprets it as arising from the first source if it is less than the reference level or as arising from the second source if it is greater than the reference level, wherein the first source is the device and the second source is the input buffer, wherein the output buffer is such as to distinguish between the two logical low levels on the line pulling the line low, and wherein the output buffer is such as to pull the bus line low only when the device is pulling the line low.

2. A buffer circuit as claimed in claim 1 wherein the input and output buffers include respective identical comparators, wherein the input buffer comparator includes means at its output whereby the input buffer pulls the line to one said logical low level when the device is not pulling the line low in use of the circuit, the other said logical low level corresponding to the low level output voltage of the device.

3. A buffer circuit as claimed in claim 2 wherein the one said logical low level lies between the second logical low level and the highest input voltage the device is guaranteed to recognize as low level.

4. A buffer circuit as claimed in claim 3 wherein the one said logical low level is closer to the said highest input voltage than the second logical low level.

5. A buffer circuit as claimed in claim 2 wherein said means includes a voltage divider for producing the one said logical low level from a source of input voltage required for the input buffer comparator.

6. A buffer circuit as claimed in claim 3 wherein the line is connected to one input of the output buffer comparator and the reference level lies between the two logical low levels and is in use applied to the other input of the output buffer comparator, and the output buffer distinguishes the two logical low levels by interpreting a signal on the one input of the output offer comparator which is below the reference level as the second logical low level, and interpreting a signal on the one input of the output buffer comparator which is above the reference level but below the said highest input voltage as the one said logical low level.

7. A buffer circuit as claimed in claim 2 wherein an output transistor is disposed at the output of the output buffer comparator and serves to increase the current sink capability and/or to absorb positive voltage transients on the bus line in use and/or to ensure that in use the bus line is not driven low while the device is in a power-off state or entering or leaving a power-off state.

8. A buffer circuit as claimed in claim 2 wherein the bus line is an open-collector bus and the outputs of the comparators are open-collector outputs.

9. A method of buffering a connection between a bus line and a device capable of reading the status of the bus line and driving it low, including the step of disposing a buffer circuit including an input buffer and an output buffer, between the bus line and an input/output terminal of the device, the buffer circuit being connected by a line to the input/output terminal;

wherein the output buffer is in the form of a comparator, and comprising the steps of determining whether a signal with a logical low level on the line is caused by the device or the input buffer pulling it low by comparing, at the output buffer comparator, and said signal with a logical low level on the line with a reference level and interpreting it as arising from the device if it is on one side of the reference level and as arising from the input buffer if it is on the other side of the reference level; and pulling the bus line low by means of the output buffer when the device is pulling the line low.

10. A method as claimed in claim 9, wherein the highest input voltage the device is guaranteed to recognise as low level is $U_c$ and one said signal with a logical low level is the low level output voltage ($U_a$) of the device, including the step of causing the input buffer to pull the line to another signal with a logical low level ($U_b$) which lies between $U_a$ and $U_c$, the output buffer comparator interpreting the $U_a$ low level as arising from the device and the $U_b$ low level as arising from the input buffer.

* * * * *